United States Patent
Miyamoto et al.

(10) Patent No.: US 8,534,967 B2
(45) Date of Patent: Sep. 17, 2013

(54) PROCESSING APPARATUS AND PROCESSING METHOD

(75) Inventors: Tsutomu Miyamoto, Kawasaki (JP); Satoshi Nakazawa, Kamiminochi-gun (JP); Takao Yamagishi, Kamiminochi-gun (JP)

(73) Assignee: Fujitsu Limited, Kawasaki (JP)

( * ) Notice: Subject to any disclaimer, the term of this patent is extended or adjusted under 35 U.S.C. 154(b) by 1035 days.

(21) Appl. No.: 12/561,499

(22) Filed: Sep. 17, 2009

(65) Prior Publication Data

US 2010/0067998 A1 Mar. 18, 2010

(30) Foreign Application Priority Data

Sep. 18, 2008 (JP) .................... 2008-238895

(51) Int. Cl.
*B23Q 15/00* (2006.01)
(52) U.S. Cl.
USPC ........... 409/132; 409/138; 409/187; 409/194; 409/207; 408/11
(58) Field of Classification Search
USPC ............... 408/6, 11; 409/131, 132, 134, 138, 409/186, 187, 193, 194, 204, 206, 207, 208, 409/209; 483/7, 8, 9, 10, 11, 12; 700/175
See application file for complete search history.

(56) References Cited

U.S. PATENT DOCUMENTS

| | | | | |
|---|---|---|---|---|
| 535,939 A | * | 3/1895 | Brearley et al. | 408/230 |
| 4,230,194 A | * | 10/1980 | Logan, Jr. | 175/379 |
| 4,629,372 A | * | 12/1986 | Huston | 407/116 |
| 4,802,095 A | * | 1/1989 | Jeppsson | 700/175 |
| 5,882,152 A | * | 3/1999 | Janitzki | 408/144 |
| 2006/0251484 A1 | * | 11/2006 | Yoshida et al. | 409/131 |

FOREIGN PATENT DOCUMENTS

| | | |
|---|---|---|
| JP | H05-185396 A | 7/1993 |
| JP | H06-114615 A | 4/1994 |
| JP | H10-277420 A | 10/1998 |
| JP | 2001-156423 A | 6/2001 |

* cited by examiner

*Primary Examiner* — Daniel Howell
*Assistant Examiner* — Michael Vitale
(74) *Attorney, Agent, or Firm* — Fujitsu Patent Center

(57) ABSTRACT

A processing apparatus for processing a workpiece includes a router bit having a processing area for processing the workpiece; an actuator for moving the relative position of the router bit with respect to the workpiece so as to place a part of the processing area of the router bit in contact with the workpiece for processing the workpiece; an adjustment mechanism for adjusting the position of the router bit relative to the workpiece; a wearing detector for detecting wear of the processing area; and a controller for controlling the adjustment mechanism, upon detection of wear of the part of the processing area of the router bit, to make a different part of the processing area of the router bit contact with the workpiece during processing.

12 Claims, 8 Drawing Sheets

PROCESSING APPARATUS AND PROCESSING METHOD

CROSS-REFERENCE TO RELATED APPLICATION

This application is based upon and claims the benefit of priority of the prior Japanese Patent Application No. 2008-238895, filed on Sep. 18, 2008, the entire contents of which are incorporated herein by reference.

FIELD

The embodiments discussed herein are related to a substrate processing apparatus and a substrate processing method.

BACKGROUND

In recent years, there grows a demand for a printed board on which electronic components are mounted with high density along with size reduction and performance enhancement of electronic devices. Most of the printed boards have a complicated shape following a shape of an electronic device. In addition, if the electronic device is a cell phone, for example, various printed boards are manufactured in accordance with various forms of cell phones.

However, in the case of automatically mounting electronic components, if the specification of a mounting device is changed in accordance with the shape of a printed board, a cost of equipment increases. To that end, a multicavity molding substrate of a predetermined rectangular shape is generally prepared to build printed boards for plural electronic devices.

At this time, since the multicavity molding substrate is rectangular and the printed board has a shape following each electronic device, a frame-like, unnecessary portion (hereinafter referred to as frame-like unnecessary portion) inevitably remains at the outer periphery of the printed board on the multicavity molding substrate. Therefore, at the time of mounting the printed board to the electronic device, an operation for separating the frame-like unnecessary portion from the printed board is preferred.

To describe a method for separating the frame-like unnecessary portion from the printed board, a groove is formed in a portion intended to separate at the outer periphery of the printed board and in addition, a connection for connecting the printed board and the frame-like unnecessary portion is formed in several positions. Then, after automatically mounting electronic components onto plural printed boards built on the rectangular multicavity molding substrate, and then, mounting each printed board to an electronic device such as a cell phone, the connection is taken off. As a result, the printed board is separated from the frame-like unnecessary portion into a single piece and mounted onto the electronic device.

To give specific methods for removing the connection, there are known (1) a manual division method for manually cutting off the connection portion, (2) a mold division method for cutting the connection using a mold with a press machine, and (3) a router bit division method for cutting and removing the connection with a router bit.

As for (1) the manual division method, however, a man power and operation time remain a major obstacle to enhancement of productivity. Further, as for (2) the cutting method with a press machine, although productivity can be increased, an expensive mold is prepared for mounted printed boards of various shapes, which inevitably involves an increase in cost for equipment.

In contrast, as for (3) the router bit method, since productivity is high upon the removal, and a requisite cost of equipment can be reduced, this method is widely used for processing separating a printed board from a frame-like unnecessary portion as discussed in Japanese Laid-open Patent Publication No. 2001-156423. In the case of separating the printed board from the frame-like unnecessary portion based on the router bit method, division processing is performed under such conditions that a multicavity molding substrate being put on a jig called a substrate holding pallet is inserted to a printed board processing apparatus (hereinafter referred to as substrate processing apparatus) as discussed in Japanese Laid-open Patent Publication No. 2001-156423.

Here, the router bit is a consumable item, which wears out with time and decrease its diameter. Up to now, if a router bit wears out by a predetermined amount or more, the worn router bit is discarded and replaced with a new router bit.

A router bit used in the above substrate processing apparatus includes a cylindrical (bar-like) bit. Further, the cutting length of the router bit is about 4 to 5 mm if the diameter is $\phi 1$ mm. Meanwhile, the thickness of a substrate to be processed is generally about 0.5 mm.

Further, the router bit is a consumable item, which wears out with time due to substrate processing and decreases its diameter. The worn router bit cannot appropriately process a substrate. To that end, if the router bit wears out beyond a predetermined ultimate wearing amount, up to now, the worn router bit is replaced with a new router bit.

According to a conventional method, processing is generally performed at a predetermined processing position of a router bit. Thus, in the case where a depth of wear in the predetermined processing position exceeds the ultimate wearing amount, even if a bit portion other than the processing position does not wear out, the router bit is replaced with a new one. As described above, the conventional method is low in usability of the router bit, resulting in problems of shortening a substantial service line of the router bit and increasing a running cost for substrate processing.

On the other hand, proposed is the structure that holds two substrates to be processed at different levels and processes the substrates using two different portions of a router bit to thereby efficiently use the router bit. Even with this structure, however, a bit portion of the router bit partially remains unused. Thus, it is difficult to say that the router bit is efficiently used.

SUMMARY

According to an aspect of the invention, a processing apparatus for processing a workpiece includes a router bit having a processing area for processing the workpiece; an actuator for moving the relative position of the router bit with respect to the workpiece so as to place a part of the processing area of the router bit in contact with the workpiece for processing the workpiece; an adjustment mechanism for adjusting the position of the router bit relative to the workpiece; a wearing detector for detecting wear of the processing area; and a controller for controlling the adjustment mechanism, upon detection of wear of the part of the processing area of the router bit, to make a different part of the processing area of the router bit contact with the workpiece during processing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments for carrying out the invention will be illustrated with reference to the drawings.

Figure 1:
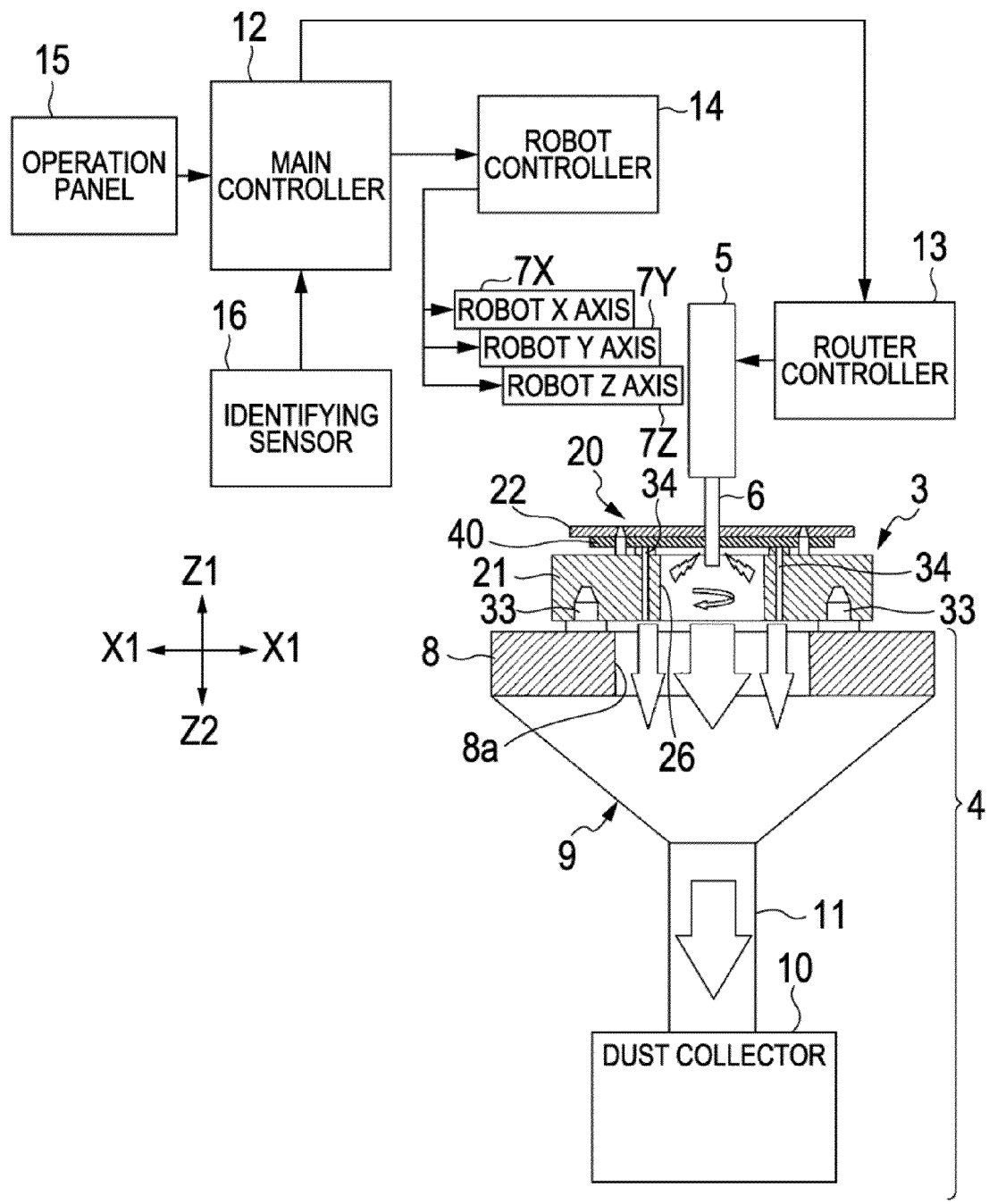
FIG. 1 is a diagram of a substrate processing apparatus according to an embodiment.
Figure 2:
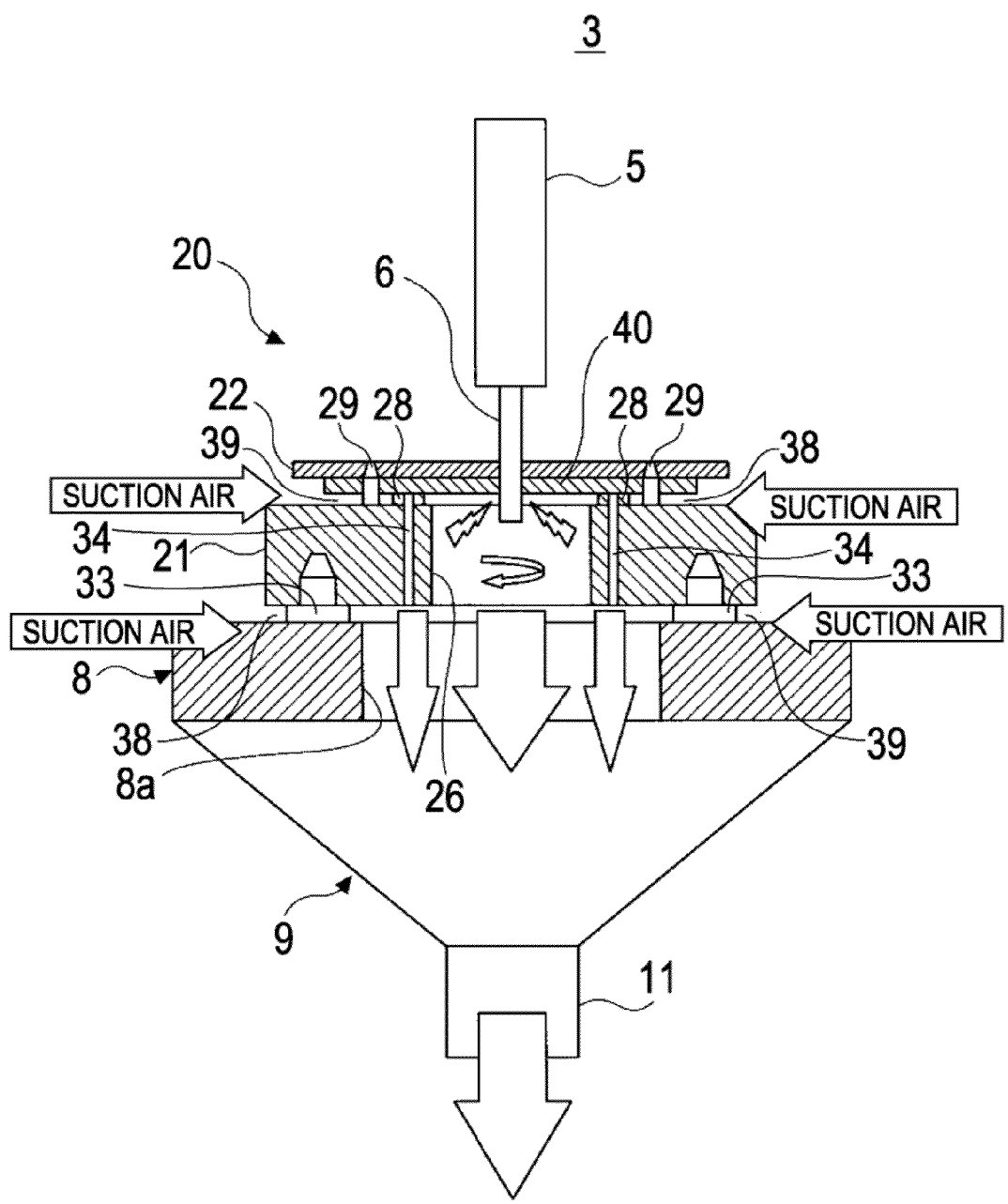
FIG. 2 is an enlarged diagram of a processing apparatus main body of a substrate processing apparatus according to an embodiment.
Figure 5:
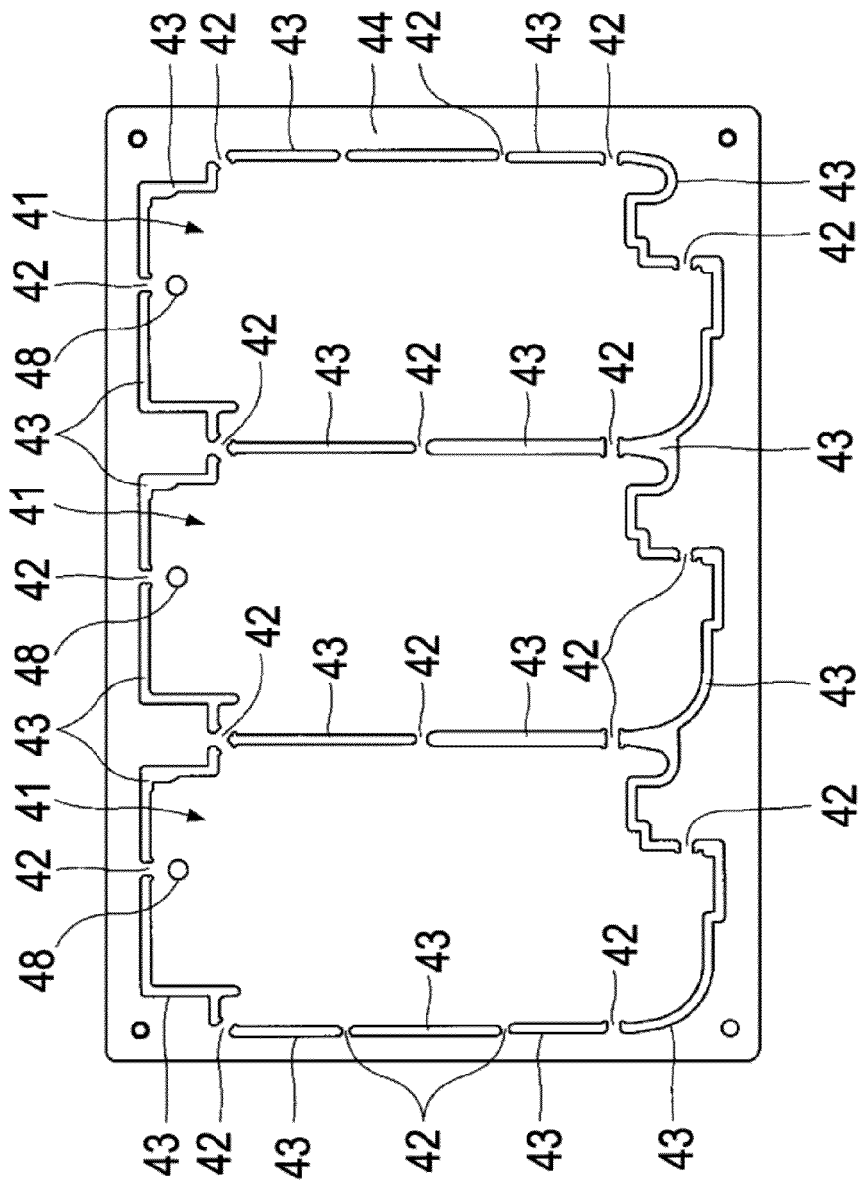
FIG. 5 is a plan view of a multicavity molding substrate to be processed with a substrate processing apparatus.

FIGS. 1 and 2 illustrate a substrate processing apparatus 1 according to an embodiment. Prior to a description about the substrate processing apparatus 1, a multicavity molding substrate 40 to be processed with the substrate processing apparatus 1 is described first for ease of explanation. FIG. 5 illustrates an example of the multicavity molding substrate 40.

The multicavity molding substrate 40 in FIG. 5 has three printed boards 41 fabricated therein. On each printed board 41, electronic devices are mounted in advance in a different process. To automatically mount the electronic devices, the multicavity molding substrate 40 has a predetermined rectangular shape (rectangular shape as seen in a plan view). Although the multicavity molding substrate 40 has a rectangular shape as above, the printed board 41 has a shape suitable for an electronic device. Thus, a frame-like, unnecessary portion (hereinafter referred to as frame-like unnecessary portion 44) inevitably remains at the outer periphery of the printed board 41 on the multicavity molding substrate 40.

An isolation groove 43 is formed at the boundary with the frame-like unnecessary portion 44 at the outer periphery of the printed board 41. The isolation groove 43 is not formed all around the printed board 41, and a connection 42 is formed in several positions. In other words, the printed board 41 is connected with the isolation groove 43 through the connection 42. The strength of the connection 42 is set not to separate the printed board 41 from the frame-like unnecessary portion 44 at the time of mounting electronic devices or the like onto the printed board 41.

Figure 6:
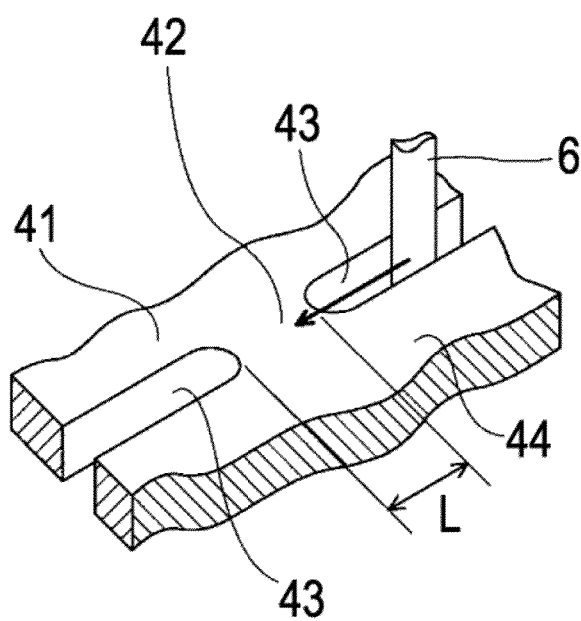
FIG. 6 illustrates how a connection is cut with a router bit.

Further, upon dividing (partitioning) the printed board 41, the connection 42 is removed using the substrate processing apparatus 1 (see FIG. 1) as described below. As illustrated in FIG. 6, the substrate processing apparatus 1 removes the connection 42 by cutting with a router bit 6 and thereby separates the printed board 41 from the frame-like unnecessary portion 44.

As illustrated in an enlarged view of FIG. 8, the router bit 6 includes a main body portion 6A inserted to the substrate processing apparatus 1 and a bit 6B extending from the main body portion 6A and used to cut the connection 42. Along with high-speed rotation of the router bit 6, the bit 6B grooves a processing object.

As illustrated in FIG. 6, the router bit 6 inserts the bit 6B into the isolation groove 43, and moves in the direction of arrow in FIG. 6 while rotating the bit 6B at a high speed to thereby remove the connection 42. As illustrated in FIG. 5, the connection 42 is formed in plural peripheral positions of the printed board 41. The substrate processing apparatus 1 separates the printed board 41 from the frame-like unnecessary portion 44 by removing all the connections 42 with the router bit 6. Here, specific processing for removing the connection 42 with the router bit 6 (processing for separating the printed board 41) will be described in detail below.

Referring back to FIG. 1, the structure of the substrate processing apparatus 1 according to an embodiment is described. The substrate processing apparatus 1 is roughly provided with a base 2, a processing apparatus main body 3, a dust collecting apparatus 4, a main controller 12, a wearing detection apparatus, a processing position movement apparatus, and the like.

The processing apparatus main body 3 includes a router head 5, the router bit 6, router moving robots 7X to 7Z, and the like. The router head incorporates a motor, and the router bit 6 is provided at the lower end of a rotating shaft of the motor. Thus, the router bit 6 is rotated by the router head 5. The motor is connected to a router controller 13, and the router controller 13 is connected to the main controller 12.

The router moving robots 7X to 7Z have a function of supporting the router head 5 as well as moving the head three-dimensionally (X-axis direction, Y-axis direction, and Z-axis direction, which are orthogonal to one another). The router moving robot 7X moves the router head 5 along the directions of arrows X1 and X2 in FIG. 1. The router moving robot 7Y moves the router head 5 along the directions of arrows Y1 and Y2 in FIG. 1 (directions vertical to the sheet in FIG. 1). The router moving robot 7Z moves the router head 5 along the directions of arrows Z1 and Z2 in FIG. 1.

The router moving robots 7X to 7Z incorporate a driving unit for moving the router head 5. As the driving unit, various driving units such as a motor, an air cylinder, and a hydraulic cylinder may be adopted. In this embodiment, a motor is used as the driving unit.

The motor provided in the router head 5 is connected to the main controller 12 through the router controller 13. Further, the motors provided in the router moving robots 7X to 7Z are connected to the main controller 12 through a robot controller 14. The main controller 12 controls the entire operation of the substrate processing apparatus 1. Along with this operation, the main controller 12 also carries out control processing for elongating a service life of the router bit 6 as described later (hereinafter this control is referred to as router bit control).

The main controller 12 receives and stores various kinds of data for separating the printed board 41 from the multicavity molding substrate 40 using an operation panel 15 and various kinds of data for controlling the router bit. The main controller 12 control the controllers 13 and 14 based on various kinds of data. Further, the main controller 12 is also connected to an identifying sensor 16 for identifying an identification hole 35 as described later.

The dust collecting apparatus 4 includes a mounting base 8, a dust collecting chamber 9, a dust collector 10, and the like. The mounting base 8 is used to place a substrate holding pallet 20 thereon as described below. The mounting base 8 is provided at the upper end of the dust collecting chamber 9. The dust collecting chamber 9 has a substantially square pyramid shape having an opening at its upper end and connected to a duct 11 at its lower end. Further, the mounting base 8 has an opening 8a, and the opening 8a communicates with the upper end of the dust collecting chamber 9.

The duct 11 is connected to the dust collector 10. The dust collector 10 includes a suction device such as a vacuum pump and a filter for collecting dust or the like. By driving the dust collector 10, a power generated upon removal of the connection 42 with the router bit 6 is sucked from the dust collecting chamber 9 to the dust collector 10 and collected by the dust collector 10.

Figure 3:
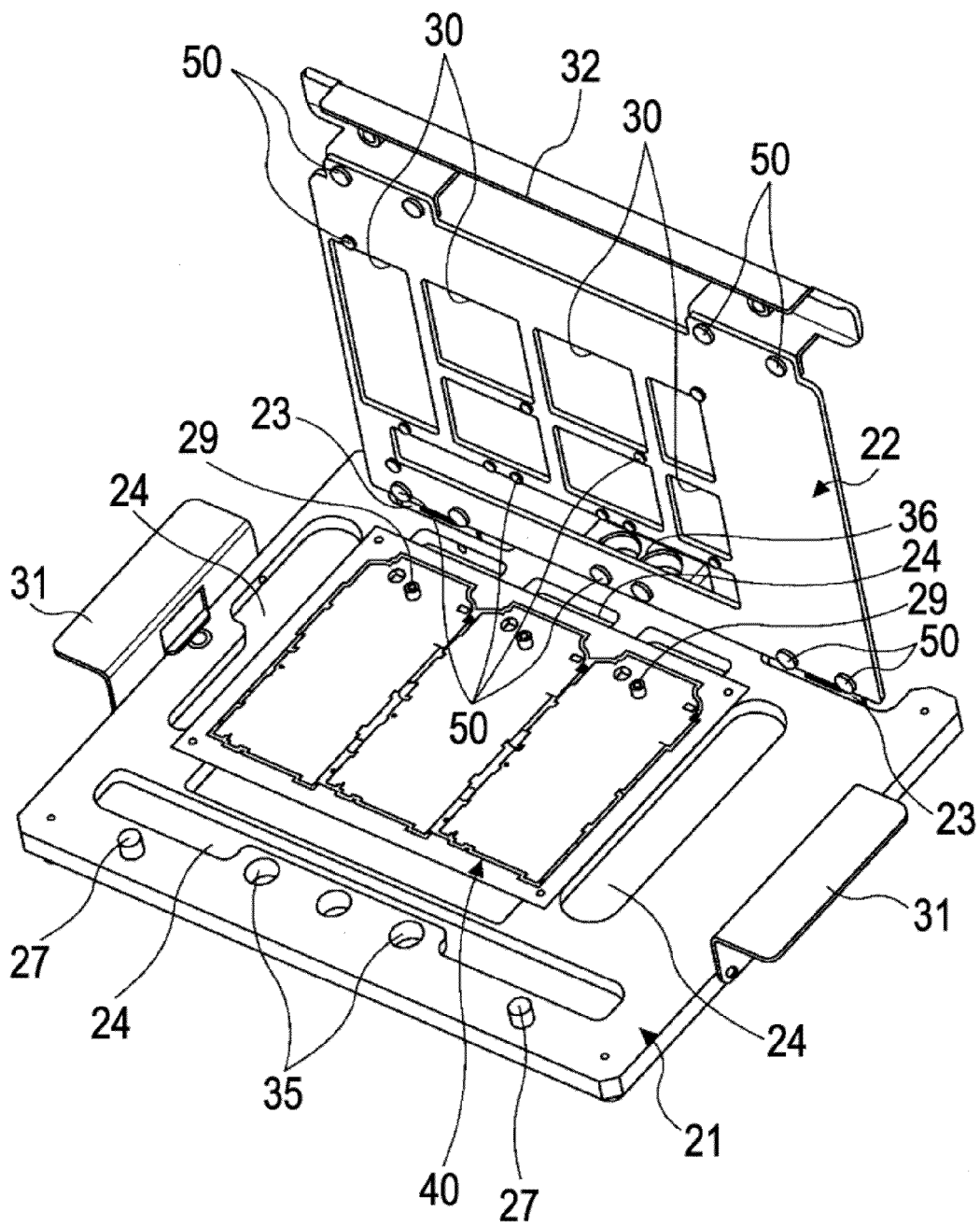
FIG. 3 is a perspective view of an uncovered substrate holding pallet.
Figure 4:
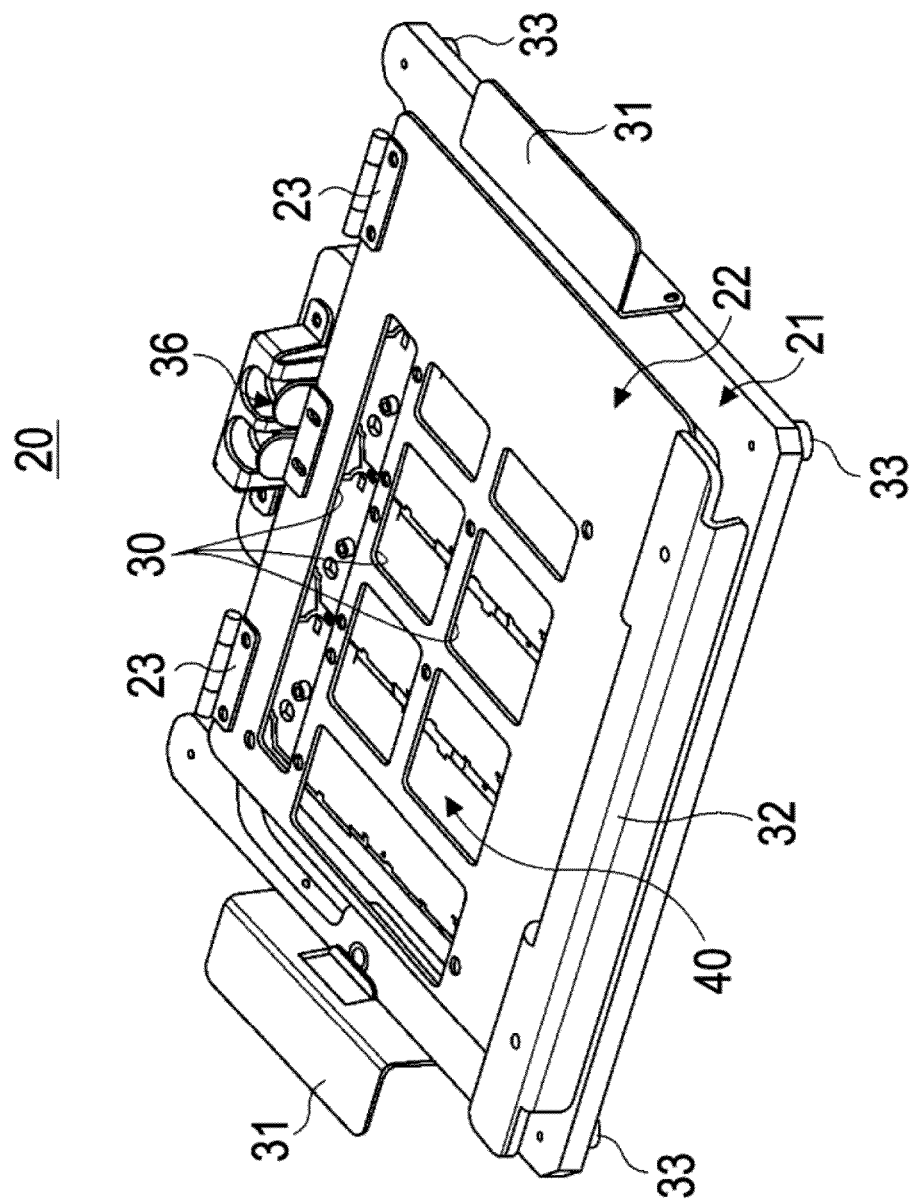
FIG. 4 is a perspective view of a covered substrate holding pallet.

FIGS. 3 and 4 illustrate the substrate holding pallet 20 attached to the substrate processing apparatus 1. FIG. 3 is a perspective view of the substrate holding pallet 20 having a cover member 22 opened. For ease of illustration, the substrate holding pallet 20 is partially different between FIGS. 1 and 2 and FIGS. 3 and 4. However, this difference is derived from a design change, and the basic structure of the substrate holding pallet 20 is the same throughout the drawings.

The substrate holding pallet 20 is roughly provided with a pallet main body 21 and the cover member 22. The pallet main body 21 and the cover member 22 are connected using a hinge, and the cover member 22 can be opened/closed with respect to the pallet main body 21.

The cover member 22 is made of magnetic metal, and magnets 27 are provided on the side of the pallet main body 21 opposite to the hinge 23. The magnets 27 function as a lock mechanism for locking the cover member 22 into a closed state. In other words, when the cover member 22 is closed (the pallet is covered), the cover member 22 is locked (fixed) to the pallet main body 21 by means of magnetic force of the magnets 27. Further, the cover member 22 can be opened with respect to the pallet main body 21 by biasing the cover member 22 in a direction for opening the cover member by means of a force equal to or more than the magnetic force of the magnets 27.

In both of FIGS. 3 and 4, the multicavity molding substrate 40 is mounted onto the pallet main body 21. In the pallet main body 21, plural recesses 24 and communicating holes 26 are formed in accordance with the connections 42 formed in the multicavity molding substrate 40.

The recesses 24 serve as a back clearance of the router bit 6 upon the removal of the connection 42 with the router bit 6. In addition, a power accompanying the removal of the connection 42 with the router bit 6 surely falls into the recesses 24. The communicating hole 26 communicates with the recesses 24 and the opening 8a formed in the mounting base 8.

As illustrated in FIG. 2, the communicating hole 26 is opened at a bottom surface 37 of the pallet main body 21. By forming the communicating hole 26, the dust collecting chamber 9 is communicating with the communicating hole 26 at the time of placing the substrate holding pallet 20 to the mounting base 8. Further, a power accompanying the removal of the connection 42 is collected by the dust collector 10 through the recesses 24, the communicating hole 26, the opening 8a, the dust collecting chamber 9, and the duct 11.

Further, plural spacer projections 28 and locating projections 29 are formed on the pallet main body 21. The spacer projection 28 is formed in plural positions at which the multicavity molding substrate 40 is placed. By placing the multicavity molding substrate 40 on the spacer projections 28, the multicavity molding substrate 40 is mounted onto the pallet main body 21.

Further, a suction hole 34 is formed through the spacer projections 28 and the pallet main body 21 (see FIG. 2). An upper end of the suction hole 34 is exposed at the upper surface of the spacer projection 28 and a lower end thereof is opened at a position opposite to the opening 8a.

Thus, if the vacuum pump provided in the dust collector 10 is driven to make an inner pressure of the dust collecting chamber 9 negative, the negative pressure also acts on the suction hole 34 through the opening 8a. As a result, if the processing apparatus main body 34 is turned into a negative pressure with the multicavity molding substrate 40 being mounted onto the spacer projections 28, the multicavity molding substrate 40 adsorbs to the spacer projections 28 due to the negative pressure. This adsorptive force functions as one holding force for holding the multicavity molding substrate 40 to the substrate holding pallet 20.

Further, the spacer projections 28 protrude from an upper surface of the pallet main body 21. Thus, a first air path 38 as a space corresponding to the height of the spacer projection 28 (for example, a 0.2 to 1.0 mm-wide space) is defined between the upper surface of the pallet main body 21 and the multicavity molding substrate 40. The first air path 38 is set larger than a powder accompanying the removal of the connection 42 with the router bit 6.

As described above, if the first air path 38 is formed between the upper surface of the pallet main body 21 and the multicavity molding substrate 40, a suction force of the dust collector 10 can act on an inner portion of the first air path 38 as well. Thus, an outside air flows into the communicating hole 26 through the first air path 38 (air flowing thereinto is referred to as suction air). Therefore, a powder generated on the upper side of the pallet main body 21 is sucked and collected with the dust collector 10 by suction air currents.

The locating projections 29 are formed in accordance with positioning holes 48 (see FIG. 5) formed in the multicavity molding substrate 40. At the time of mounting the multicavity molding substrate 40 on the substrate holding pallet 20, the multicavity molding substrate 40 is placed onto the pallet main body 21 such that the positioning holes 48 are inserted into the locating projections 29. Thus, the multicavity molding substrate 40 is mounted onto the pallet main body 21 in a simple manner with high positional accuracy.

In addition, spacers 33 are provided on four corners of the bottom surface of the pallet main body 21. With this structure, a second air path 39 as a space corresponding to the height of the spacer 33 (for example, a 0.2 to 1.0 mm-wide space) is defined between the pallet main body 21 and the upper surface of the mounting base 8. The first air path 39 is set larger than a powder accompanying the removal of the connection 42 with the router bit 6.

As described above, if the second air path 398 is formed between the upper surface of the pallet main body 21 and the multicavity molding substrate 40, a suction force of the dust collector 10 can act on an inner portion of the second air path 39 as well. Thus, an outside air flows into the communicating hole 26 through the second air path 39 (air flowing thereinto is referred to as suction air). Therefore, a powder generated on the lower side of the pallet main body 21 is sucked and collected with the dust collector 10 by suction air currents.

Further, as illustrated in FIG. 3, plural (three in this embodiment) identification holes 35 are formed near the outer edge of the pallet main body 21. The identification holes 35 constitute an identification mark by appropriately combining formation positions and sizes thereof. In this embodiment, the kind of the multicavity molding substrate 40 mounted onto the substrate holding pallet 20 is identified using the identification holes 35. Since the identification holes 35 are unique to the substrate holding pallet 20, identification holes are formed in different positions with different sizes from those of this embodiment in a substrate holding pallet having different structure from that of this embodiment, on which a multicavity molding substrate is mounted.

Main body gripping portions 31 are provided on both sides of the pallet main body 21. The main body gripping portions 31 are used at the time of installing/removing the substrate holding pallet 20 to/from the mounting base 8.

On the other hand, the cover member 22 can be opened/closed with respect to the pallet main body 21 as above. The cover member 22 covers the entire upper surface of the multicavity molding substrate 40 when closed. In this closed state, the cover member 22 functions to secure the multicavity molding substrate 40 into the substrate holding pallet 20. Further, the cover member 22 functions as a protective cover for protecting the multicavity molding substrate 40 as well as functions to secure the substrate holding pallet 20.

The cover member 22 has plural router holes 30. The router holes 30 are formed in accordance with positions where the connections 42 are formed on the multicavity molding substrate 40 in the case where the cover member 22 is closed with the multicavity molding substrate 40 being mounted. In other words, the connections 42 of the multicavity molding substrate 40 are exposed from the router holes 30 with the cover member 22 being closed. Further, the router holes 30 are formed with such a size as allows insertion of the router bit 6 of the substrate processing apparatus 1 and processing for cutting off the connection 42. As a result, the multicavity molding substrate 40 can be processed using the router bit 6 with the cover member 22 being closed.

Further, plural holding projections 50 are formed on the side of the cover member 22 opposite to the pallet main body 21. The holding projections 50 are made of an elastic material. As the elastic material, various materials such as rubber or spring may be used. In this embodiment, synthetic rubber is used. The holding projections 50 bring into contact with the multicavity molding substrate 40 with the cover member 22 being closed and press the multicavity molding substrate 40 against the pallet main body 21.

As described above, the cover member 22 is fixed (locked) to the pallet main body 21 by means of magnetic force of the magnets 27 with the cover member 22 being closed. The magnetic force of the magnets 27 is set to apply a force stronger than an elastic restoring force generated from the plural holding projections 50. Therefore, even if the holding projections 50 press the multicavity molding substrate 40, the cover member 22 is not easily opened.

Further, positions of the router head 50 are determined to press the multicavity molding substrate 40 against both of the board 41 and frame-like portion 44 constituting the multicavity molding substrate 40. With this structure, the connections 42 are removed with the router bit 6. Thus, even if the board 41 is separated from the frame-like portion 44, the board 41 and the frame-like portion 44 can be kept secured in the substrate holding pallet 20.

Here, a cover member holding portion 32 is formed at both ends of the cover member 22. The cover member holding portion 32 is used to open/close the cover member 22.

To mount the multicavity molding substrate 40 onto the thus-structure substrate holding pallet 20, the cover member 22 is opened against the magnetic force of the magnets 27. The substrate holding pallet 20 of this embodiment is provided with an opened cover keeping mechanism 36. The cover member 22 is kept opened by the opened cover keeping mechanism 36.

The multicavity molding substrate 40 is placed onto the pallet main body 21 in the uncovered state. At this time, the multicavity molding substrate 40 is placed onto the pallet main body 21 such that 48 formed in the multicavity molding substrate 40 are inserted to the locating projections 29 formed on the pallet main body 21.

The multicavity molding substrate 40 can be mounted onto the pallet main body 21 with high positioning accuracy through as simple processing as insertion of the positioning holes 48 into the locating projections 29. Further the first air path 38 corresponding to the height of the spacer projections 28 is defined between the multicavity molding substrate 40 and the upper surface of the pallet main body 21 with the multicavity molding substrate 40 being mounted onto the pallet main body 21 (see FIG. 2).

If the multicavity molding substrate 40 is mounted to the pallet main body 21 as above, the cover member 22 is closed. As described above, the cover member 22 is made of a metal member including a magnetic member and thus sucked by means of a magnetic force of the magnets 27 provided on the pallet main body 21. Thus, the cover member 22 is fixed (locked) to the pallet main body 21.

At this time, the holding projections 50 are formed on the cover member 22 to press the multicavity molding substrate 40 against the pallet main body 21 in the covered state in this embodiment. As a result, the multicavity molding substrate 40 can be firmly secured into the substrate holding pallet 20, and the multicavity molding substrate 40 is not misaligned in the substrate holding pallet 20.

A wearing detector includes the main controller 12. The main controller 12 of the wearing detector detects a depth of wear of the router bit 6 based on a processing distance upon a process for cutting off (processing for removing) the connections 42 with the router bit 6 as described in detail below. In this embodiment, a description is given of an example of a wearing amount detecting method that determines, by calculation, a processing distance upon processing for cutting off the connection 42 with the router bit 6. However, an image pickup device or a non-contact sensor may be used as a wearing detector, and a method for directly detecting a depth of wear of the router bit 6 may be used instead.

A processing position moving apparatus includes the main controller 12 and the router moving robot 7Z (that is an adjustment mechanism). The processing position moving apparatus drives the router moving robot 7 to move the router bit 6 in a vertical direction (Z direction) if the depth of wear of the router bit 6 exceeds a predetermined ultimate wearing amount, and thereby can function to move a processing portion of the router bit 6 relative to the multicavity molding substrate 40 toward a different position (as described in detail below).

Figure 7:
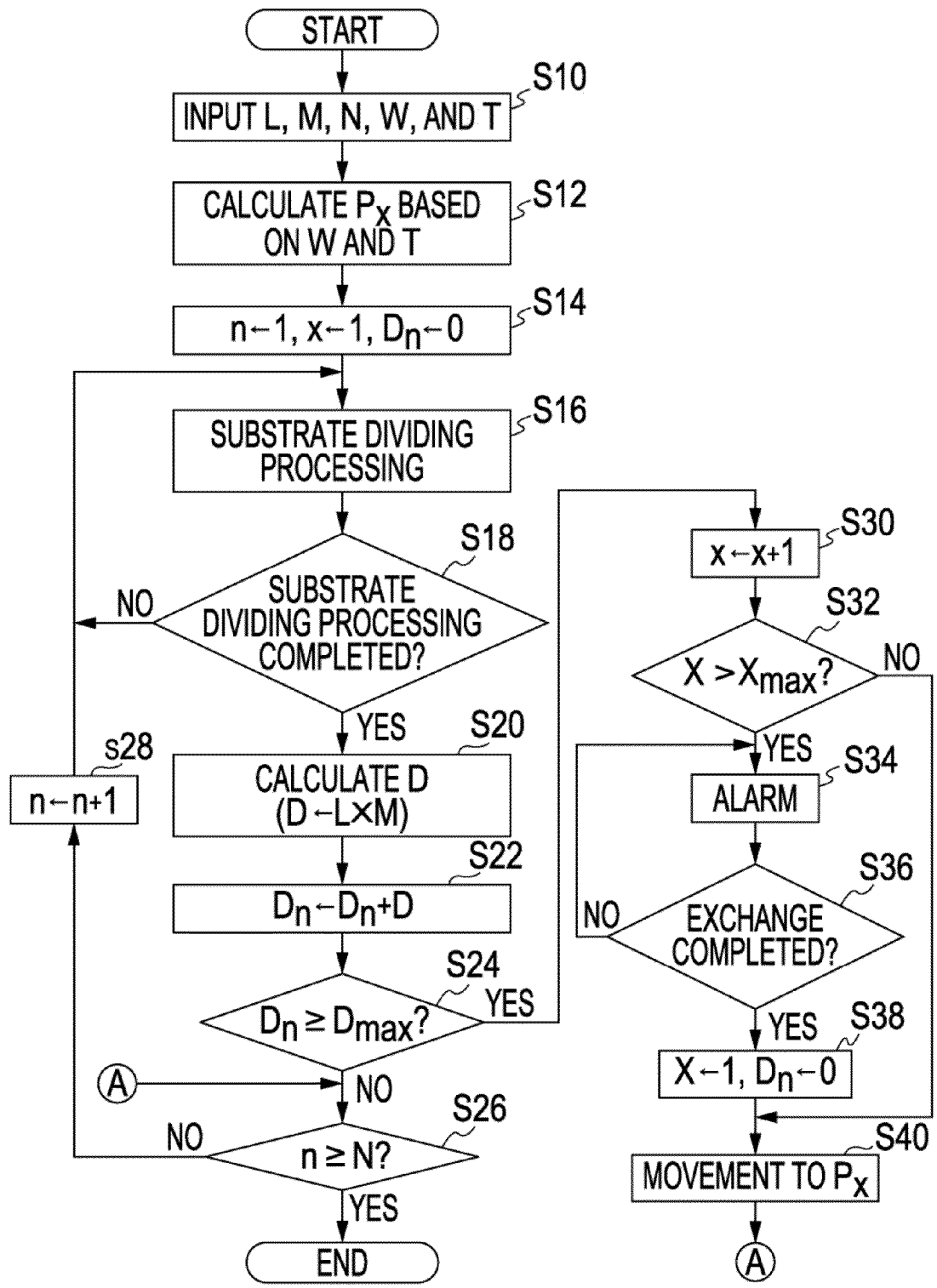
FIG. 7 is a flowchart of a substrate processing process.

Next, processing for removing the connection 42 of the multicavity molding substrate 40 with the substrate processing apparatus 1 thus structured (referred to as substrate processing process) is described. FIG. 7 is a flowchart of the substrate processing process for the multicavity molding substrate 40 executed by the main controller 12 of the substrate processing apparatus 1. Here, the substrate processing apparatus 1 is attached with a new router bit 6 (router bit unused for cutting processing) prior to the substrate processing process.

If the substrate processing apparatus 1 is activated to start substrate processing process, processing for inputting various kinds of data for the substrate processing process is performed first (step 10; in the drawing, step is abbreviated to S). This input processing is performed using the operation panel 15. Specific examples of the input data include a length L of the connection 42 (see FIG. 6), the number M of connections 42, the number N of multicavity molding substrates to be processed, a thickness W of the multicavity molding substrate 40, and a cutting length T of the router bit 6.

After the completion of the input processing, the main controller 12 acquires the data input in step 10 and determines, by calculation, a length of a processing area Px based on the thickness W of the multicavity molding substrate 40 and the cutting length T of the router bit 6 among the input data (step 12). Referring to FIG. 8A to 8D, the processing area Px is described.

Figure 8A:
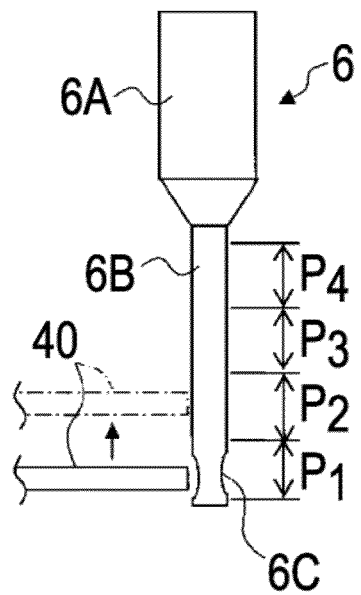
FIGS. 8A to 8D illustrate an operation of a substrate processing apparatus according to an embodiment.

As described above, the router bit 6 rotates at a high speed to groove (cuts) the multicavity molding substrate 40 as a processing object using the bit 6B. As a result, the connection 42 is removed and the printed board 41 is partitioned. Upon the removal of the connection 42, the bit 6B of the router bit 6 also wears out. The depth of wear of the bit 6B increases with time and finally, a worn portion 6C with the diameter smaller than that of the other portions in section is formed as illustrated in FIG. 8A.

If the worn portion 6C is formed as above, the connections 42 cannot be removed as appropriate and in addition, the strength of the router bit 6 is decreased. To that end, if the depth of wear of the worn portion 6C is equal to or more than a predetermined value, the router bit 6 is generally replaced with a new one (the depth of wear that requires replacement is hereinafter referred to as ultimate wearing amount).

In a conventional structure, the multicavity molding substrate 40 brings into contact with the same position of the bit 6B of the router bit 6 and undergoes cutting processing. If the worn portion 6C is formed with the ultimate wearing amount or more at the same position, the router bit 6 is replaced.

However, the length of the bit 6B of the router bit 6 is about 4 to 5 mm if the diameter of the bit 6B is φ1 mm. Meanwhile, the thickness of the multicavity molding substrate 40 as a processing object is generally about 0.5 mm. Thus, as for the conventional structure, in such a state that the worn portion 6C is partially formed in the bit 6B of the router bit 6, in other words, many processable areas remain, the router bit 6 is replaced.

In contrast, according to this embodiment, the minimum possible area of the bit 6B for cutting processing (removal of the connections 42) for the multicavity molding substrate 40 is determined in step 12 (this minimum area is referred to as processing area Px). The processing area Px can be determined based on the cutting length T of the router bit 6 and the thickness W of the multicavity molding substrate 40.

In the example illustrated in FIG. 8A to 8D, the maximum number Xmax of processing areas set in the bit 6B is 4 (Xmax=4). Thus, four processing areas P1 to P4 are set in the bit 6B. As described above, the main controller 12 can also function as a processing condition determination device (a condition determinator) for setting the processing areas P1 to P4 based on the cutting length T of the router bit 6 and the thickness W of the multicavity molding substrate 40.

Here, the maximum number Xmax of processing areas set in the bit 6B is not limited to 4 but may be derived from the cutting length T of the router bit 6 and the thickness W of the multicavity molding substrate 40 as above. To be specific, the maximum number Xmax of processing areas increases as the cutting length T of the router bit 6 increases while the maximum number Xmax of processing areas decreases as the thickness W of the multicavity molding substrate 40 increases.

After the processing area Px has been determined, an initial value is subsequently set (step 14). Upon the initial value setting processing, the number n of multicavity molding substrates to be processed is set to 1 (n<−1), a processing area value X is set to 1 (X<−1), and an integrated processing distance Dn is set to 0 (Dn<−0). Here, the integrated processing distance Dn is the total amount of cutting processing of the router bit 6.

This embodiment employs a method for determining whether the worn portion 6C of the router bit 6 reaches the ultimate wearing amount based on the total amount of cutting processing of the router bit 6 as described below. Further, prior to the substrate processing process, a new router bit 6 is attached to the substrate processing apparatus 1 as described above. Therefore, in step 14, an initial value of the integrated processing distance Dn is set to 0 (Dn<−0).

After the completion of setting the initial values, substrate dividing processing for removing the connections 42 from the multicavity molding substrate 40 with the router bit 6 is performed (step 16).

Prior to the substrate dividing processing, the substrate holding pallet 20 having the multicavity molding substrate 40 mounted thereonto is first placed to the substrate processing apparatus 1. The substrate processing apparatus 1 is provided with a not-illustrated holding mechanism for the substrate holding pallet 20. With this holding mechanism, the substrate holding pallet 20 is placed on the mounting base 8. The second air path 39 corresponding to the height of the spacers 33 is defined between the upper surface of the mounting base 8 and the pallet main body 21 with the pallet being placed thereon.

After the completion of placing the pallet thereon, the kind of the placed 40 is identified based on a signal from the identifying sensor 16. The identifying sensor 16 detects positions and diameters of the identification holes 35 formed in the pallet main body 21 and transmits the detection information to the main controller 12. The main controller 12 stores shape data of the multicavity molding substrate 40 mounted onto the substrate holding pallet 20 in advance. The main controller 12 reads shape data of the multicavity molding substrate 40 mounted to the substrate processing apparatus 1 (the substrate holding pallet 20) from a not-illustrated storage device based on the detection information sent from the identifying sensor 16.

Next, the main controller 12 drives the router head 5 by way of the router controller 13 to rotate the router bit 6 as well as moves the router bit 6 toward the multicavity molding substrate 40 to start processing for removing the connection 42. At the same time, the main controller 12 activates the dust collector 10. As a result, the dust collecting apparatus 4 starts processing for sucking a powder.

To be specific, the removal of the connection 42 with the substrate processing apparatus 1 is carried out as follows. First, the main controller 12 selects a target connection 42 for removal based on the prestored shape data of the multicavity molding substrate 40. Subsequently, the main controller 12 reads positional data of the target connection 42 for removal and drives the router moving robots 7X to 7Z to move the router bit 6 to a position above the target connection 42 for removal.

Subsequently, the main controller 12 drives the router moving robots 7X to 7Z to insert the isolation groove 43 near the target connection 42 for removal through the router hole 30 formed in the substrate holding pallet 20 (cover member 22) (see FIG. 6).

At this time, since the processing area value X is set to 1 in step 14 as above, the main controller 12 adjusts a Z-directional position of the router bit 6 relative to the multicavity molding substrate 40 so that the lowermost processing area P1 (closest to the Z2 side) among the processing areas P1 to P4 set in the bit 6B of the router bit 6 can cut off the connection 42 (see FIG. 8A). The positioning processing is performed by the main controller 12 driving the router moving robot 7Z under control.

Following this, the main controller 12 drives the router moving robots 7X and 7Y based on the shape data with the router bit 6 being fixed in the Z direction to move the router bit 6 in the X and Y directions to cut off the connection 42. As a result, the connection 42 formed on the multicavity molding substrate 40 is removed with the router bit 6. The main controller 12 drives the router moving robots 7X to 7Z under control to thereby apply the above cutting processing to all connections 42.

Upon the removal of the connection 42 with the router bit 6, a strong external force is applied to the multicavity molding substrate 40. However, the multicavity molding substrate 40 is securely holed on the substrate holding pallet 20 and thus, the multicavity molding substrate 40 is not misaligned.

Further, the first air path 38 and the second air path 39 through which a suction air supplied from the dust collector 10 flows are defined in the substrate holding pallet 20 and between the substrate holding pallet 20 and the substrate processing apparatus 1, and a powder accompanying the processing for cutting off the connection 42 is discharged to the dust collector 10 through the first air path 38 and the second air path 39. Thus, no powder remains on the substrate holding pallet 20 and adheres to the divided printed board 41 and an electronic device to which the printed board 41 is mounted. Thus, reliability of the printed board 41 and electronic device can be increased.

In step 18, it is determined whether the substrate dividing processing (processing in step 16) for the multicavity molding substrate 40 is completed. Here, the determination as to whether the substrate dividing processing is completed means a determination as to whether processing for one multicavity molding substrate 40 is completed.

In step 18, if it is determined that the substrate dividing processing is completed (YES), the processing advances to step 20, and the main controller 12 calculates a unit processing distance D. The unit processing distance D means a cutting processing distance the router bit 6 has moved to remove all connections 42 on one multicavity molding substrate 40. The unit processing distance D can be determined by multiplying the length L of the connection 42 by the number M of connections 42 (D<–L×M).

In step 20, the unit processing distance D is determined, after which the main controller 12 adds the integrated processing distance Dn and a current unit processing distance D, and updates the integrated processing distance Dn to the added value (Dn<–Dn+D: step 22). Thus, the integrated processing distance Dn calculated in step 22 corresponds to the total cutting processing distance a new router bit 6 has moved to cut the multicavity molding substrate 40 after being attached to the substrate processing apparatus 1.

After the integrated processing distance Dn has been calculated in step 22, the main controller 12 compares the integrated processing distance Dn with the ultimate wearing amount Dmax (step 24).

Here, the ultimate wearing amount Dmax is described. For ease of explanation, prior to the description about the ultimate wearing amount Dmax, an ultimate wear depth as a prerequisite for the ultimate wearing amount Dmax is described. The ultimate wear depth refers to a depth of wear resulting from cutting processing of one processing area Px, which makes the processing position worn out with time and unusable. The ultimate wear depth of the router bit 6 can be determined in advance by experiment.

Further, the ultimate wear depth of the router bit 6 correlates with a cutting distance of a processing object to be cut with the router bit 6 (in this embodiment, the connections 42). In other words, the ultimate wear depth increases along with an increase in cutting distance of the processing object cut with the router bit 6. Thus, in this embodiment, the ultimate wear depth is converted into the cutting distance to thereby obtain the ultimate wearing amount Dmax. Accordingly, if the integrated processing distance Dn is calculated based on how much the router bit 6 is used, and the resultant integrated processing distance Dn exceeds the ultimate wearing amount Dmax, the router bit 6 can be determined to be worn out by the ultimate wearing amount.

In step 24, if it is determined that the integrated processing distance Dn does not exceed the ultimate wearing amount Dmax (NO), the processing for cutting the connections 42 with the router bit 6 (removal processing) can be performed. Thus, if a determination result is negative in step 24, the main controller 12 determines whether processing is completed for all of the number N of multicavity molding substrates 40 to be processed (step 26).

If the dividing processing is completed for all of the number N of multicavity molding substrates 40 to be processed in step 26, the main controller 12 terminates the dividing processing for the multicavity molding substrate 40. On the other hand, if it is determined that the dividing processing is not completed for all of the of the number N of multicavity molding substrates 40 to be processed in step 26, the main controller 12 increments the number n of substrates to be processed only by "1" (step 28) and returns the processing to step 16. From then on, processing in steps 16 to 26 is repeated until the dividing processing is completed for all of the N multicavity molding substrates 40 corresponding to the number of substrates to be processed.

On the other hand, if it is determined that the integrated processing distance Dn exceeds the ultimate wearing amount Dmax in step 24 (YES), the main controller 12 increments the processing area value X in step 30 (X<–X+1) as well as determines whether the incremented processing area value X exceeds the maximum number Xmax of processing areas (step 32).

The maximum number Xmax of processing areas refers to the maximum possible number of processing areas Px set in one router bit 6. The maximum number Xmax of processing areas can be determined based on the processing area Px and the length T of the router bit 6. More specifically, if T=Px×n+r (n is an integer, 0<r<Px), n is the maximum number Xmax of processing areas. As described above, the processing area Px can be derived from the thickness W of the multicavity molding substrate 40 and the cutting length T of the router bit 6.

In step 32, it is determined that the processing area value X is equal to or smaller than the maximum number Xmax of processing areas in the case where the router bit 6 has a processing area Px capable of cutting the multicavity molding substrate 40. Thus, in this case, the main controller 12 drives the router moving robot 7Z to move the router bit 6 so as to process the multicavity molding substrate 40 with as many processing areas Px as the processing area value X incremented in the router holes 30 (step 40).

Referring to FIG. 8A to 8D, a specific example of the processing for moving the router bit 6 in step 40 is explained. As illustrated in FIG. 8(A), it is assumed here that the processing area value X is set to 1 and thus, the processing area P1 is used to cut the multicavity molding substrate 40 (connections 42). In this state, if the depth of wear of the processing area P1 is equal to or more than the ultimate wearing amount Dmax as illustrated in FIG. 8A, a positive determination is made in step 24 as above (YES), and the main controller 12 increments the processing area value X in step 30. At this time, since the processing area value X is 1 before the processing in step 30, the processing area value X is newly set to 2 after this processing in step 30.

Subsequently, the main controller 12 drives the router moving robot 7Z to move the router bit 6 downwards relative to the multicavity molding substrate 40 to move the router bit 6 up to a position opposite to the processing area P2 as indicated by the dashed line in FIG. 8A. As a result, the multicavity molding substrate 40 opposes the processing area P2 where the router bit 6 (bit 6B) is not worn. Then, the multicavity molding substrate 40 (connections 42) is subjected to cutting processing in this processing area P2.

The processing for moving the router bit 6 in the Z direction relative to the multicavity molding substrate 40 to change the processing area Px is executed each time it is determined that the integrated processing distance Dn exceeds the ultimate wearing amount Dmax in step 24 or until the processing area value X incremented in step 30 exceeds the maximum number Xmax of processing areas in step 32.

Figure 8B:
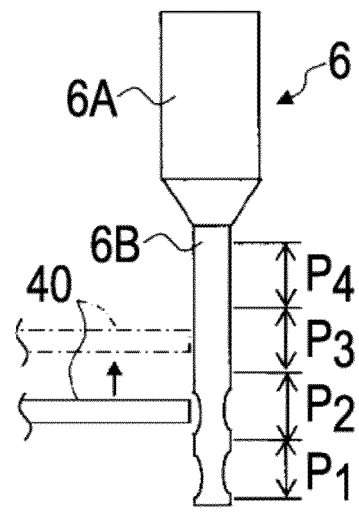
Figure 8C:
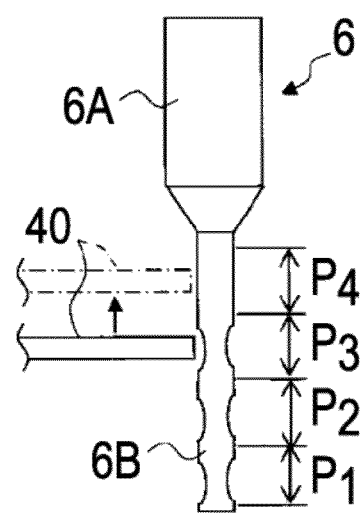

Accordingly, as illustrated in FIG. 8B, if it is determined that the processing area P2 exceeds the ultimate wearing amount Dmax as a result of cutting processing on the multicavity molding substrate 40 with the processing area P2 of the router bit 6, the main controller 12 moves the router bit 6 up to a position where the processing area P3 opposes the multicavity molding substrate 40 (position indicated by the dashed line in FIG. 8B). Likewise, as illustrated in FIG. 8C, if it is determined that the processing area P3 exceeds the ultimate wearing amount Dmax as a result of cutting processing on the multicavity molding substrate 40 with the processing area P3 of the router bit 6, the main controller 12 moves the router bit 6 up to a position where the processing area P4 opposes the multicavity molding substrate 40 (position indicated by the dashed line in FIG. 8B).

In this embodiment, the multicavity molding substrate 40 (connections 42) is subjected to cutting processing first using the lowermost processing area P1 out of the processing areas Px (X=1 to 4). If the depth of wear of the processing area P1 reaches the ultimate wearing amount Dmax, the cutting processing is performed with the processing area P2 above the processing area P1 (area closer to the main body portion 6A). Subsequently, if the depth of wear of the processing area P2 reaches the ultimate wearing amount Dmax, the cutting processing is performed with the processing area P3 above the processing area P2 (area closer to the main body portion 6A).

In this way, the cutting position is successively moved to an upper processing area from the lowermost processing area P1, making it possible to keep the cutting strength of the router bit 6. Even if any processing area Px in the router bit 6 wears out by the ultimate wearing amount Dmax (ultimate wear depth), with the result that the cutting processing position of the bit 6B relative to the multicavity molding substrate 40 is changed, stability and safety of the cutting processing can be maintained.

Figure 8D:
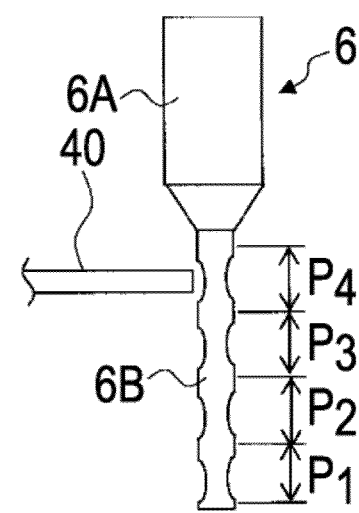

On the other hand, it is determined that as illustrated in FIG. 8D, if it is determined that the processing area P4 exceeds the ultimate wearing amount Dmax as a result of cutting processing on the multicavity molding substrate 40 with the processing area P4 of the router bit 6, the processing area value X calculated in step 30 is 5. In the illustrated example of FIG. 8A to 8D, since the maximum number Xmax of processing areas is 4, a determination result is positive in step 32 (YES). In this way, the processing area value X exceeds the maximum number Xmax of processing areas in step 32 in the case where all of the processing areas P1 to P4 perform processing by the ultimate wearing amount Dmax (ultimate wear occurs), in other words, the router bit 6 is preferably replaced.

Thus, if a positive determination is made in step 32, the main controller 12 gives an alarm to the effect that the router bit 6 is preferably replaced in step 34. The alarm is continued until replacement with a new router bit 6 is completed (step 36). On the other hand, after the completion of replacement with a new router bit 6 (positive determination is made in step 36), the main controller 12 sets the processing area value X to 1 as well as sets the integrated processing distance Dn to P (X<--1, Dn<--0). After the completion of processing in steps 30 to 40, the main controller 12 returns the processing to step 26 and perform processing in step 26 and subsequent steps.

As described above, the substrate processing apparatus 1 of this embodiment and the substrate processing method using the apparatus can elongate the service life of the router bit 6 compared to conventional substrate processing apparatus and substrate processing method. To be specific, according to the conventional ones, if the router bit 6 wears out in any position by the ultimate wearing amount or more, the router bit 6 is immediately replaced and thus, a processable distance for cutting processing of the router bit 6 is the ultimate wearing amount Dmax. In contrast, according to this embodiment, if the processing area value X is 4 in FIG. 8A to 8D, the processable distance for cutting processing on the multicavity molding substrate 40 with one router bit 6 is (Dmax×4), which is four times longer than the conventional one.

As described above, a processable distance of one router bit 6 for cutting processing is longer than the conventional one. Hence, the number of router bits 6 can be reduced and a processing cost can be saved. Further, the number of times the router bit 6 is replaced is reduced, making it possible to enhance processing efficiency of the substrate processing apparatus 1 at the time of processing the multicavity molding substrate 40.

The preferred embodiments are described in detail above but the present invention should not be construed as being limited by any particular embodiment and should be construed as being modified and changed in various ways without departing from the gist of the present invention described in the scope of claims.

The preferred embodiments are described in detail above but the present invention should not be construed as being limited by any particular embodiment and should be construed as being modified and changed in various ways without departing from the gist of the present invention described in the scope of claims.

To elaborate, this embodiment describes an example where the substrate holding pallet 20 is applied to the substrate processing apparatus 1 using the router bit 6. However, the substrate holding pallet 20 is applicable to any other processing apparatus.

Further, this embodiment describes an example where the processing apparatus is used to process a printed board, but the processing apparatus according to this embodiment is applicable to processing of an acrylic plate, a glass plate, or woods.

According to the above embodiments, a service line of a router bit can be elongated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A processing apparatus for processing a workpiece, comprising:
    a router bit having a processing area for processing the workpiece;
    an actuator for moving the relative position of the router bit with respect to the workpiece so as to place a part of the processing area of the router bit in contact with the workpiece for processing the workpiece;
    an adjustment mechanism for adjusting the position of the router bit relative to the workpiece;
    a wearing detector for detecting wear of the processing area; and
    a controller for controlling the adjustment mechanism, upon detection of wear of the part of the processing area of the router bit, to make a different part of the processing area of the router bit contact with the workpiece during processing.

2. The processing apparatus according to claim 1, further comprising a condition determinator for acquiring a record of an amount of processing of the workpiece, wherein the wearing detector detects wear of the processing area by calculating an amount of wear at the part of the processing area on the basis of the record.

3. The processing apparatus according to claim 2, wherein after the amount of wear at the part of the processing area exceeds a predetermined amount of wear, the adjustment mechanism adjusts so that the different part of the processing area of the router bit comes into contact with the workpiece.

4. The processing apparatus according to claim 2, wherein the record includes a dimension information of the workpiece and the controller makes the adjustment mechanism adjust the position of the router bit on the basis of the dimension information.

5. The processing apparatus according to claim 1, wherein the wearing detector detects the depth of wear by detecting a geometric change in the router bit.

6. The processing apparatus according to claim 2, wherein the record has a dimension information of the workpiece and the condition determinator determines a plurality of portions in the processing area of the router bit on the basis of the dimension, the part of the processing area is one of the portions, and the different part of the processing area is another of the portions.

7. The processing apparatus according to claim 1, wherein the workpiece is a substrate having multicavities, further comprising a mounting base having a substrate holding pallet for holding the substrate so as to hold the substrate at a level relative to the router bit.

8. A processing method for processing a workpiece, comprising:
    processing the workpiece by a router bit having a processing area, the router bit being capable of placing a part of the processing area of a router bit in contact with the workpiece during processing the workpiece;
    detecting wear of the processing area; and
    adjusting the position of the router bit relative to the workpiece, upon detection of wear of the part of the processing area of the router bit, to make a different part of the processing area of the router bit contact with the workpiece during processing.

9. The processing method according to claim 8, wherein the adjustment of the position is done after an amount of wear at the part of the processing area exceeds a predetermined amount of wear.

10. The processing method according to claim 8, wherein the adjustment of the position is done on the basis of a dimension and the number of the processing portion of the workpiece processed by the router bit.

11. The processing method according to claim 8, wherein the adjustment of the position is done by detecting a geometric change in the router bit.

12. The processing method according to claim 8, further comprising:
    determining a plurality of portions in the processing area on the basis of the thickness, wherein the part of the processing area is one of the portions, and the different part of the processing area is another of the portions.

* * * * *